(12) United States Patent
Kim et al.

(10) Patent No.: US 7,446,333 B2
(45) Date of Patent: Nov. 4, 2008

(54) NONVOLATILE MEMORY DEVICES AND METHODS OF MANUFACTURING THE SAME

(75) Inventors: Dong-Chul Kim, Suwon-si (KR); In-Gyu Baek, Seoul (KR); Young-Kwan Cha, Suwon-si (KR); Moon-Sook Lee, Seoul (KR); Sang-Jin Park, Yongin-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 152 days.

(21) Appl. No.: 11/511,469

(22) Filed: Aug. 29, 2006

(65) Prior Publication Data
US 2007/0045692 A1 Mar. 1, 2007

(30) Foreign Application Priority Data
Aug. 31, 2005 (KR) .................... 10-2005-0080617

(51) Int. Cl.
*H01L 29/04* (2006.01)

(52) U.S. Cl. .................................. 257/3; 257/E45.003
(58) Field of Classification Search .................. 257/3, 257/530, 621, E45.003
See application file for complete search history.

(56) References Cited

U.S. PATENT DOCUMENTS

| | | | |
|---|---|---|---|
| 6,610,463 B1 * | 8/2003 | Ohkura et al. | 430/322 |
| 7,079,250 B2 * | 7/2006 | Mukai | 356/445 |
| 2002/0014621 A1 * | 2/2002 | Den et al. | 257/3 |

* cited by examiner

*Primary Examiner*—Marcos D. Pizarro
*Assistant Examiner*—Bilkis Jahan
(74) *Attorney, Agent, or Firm*—Harness, Dickey & Pierce, PLC

(57) ABSTRACT

Nonvolatile memory devices and methods of manufacturing the same are provided. The nonvolatile memory devices may include an oxide layer formed of a resistance conversion material, a lower electrode, a nano-wire layer formed of a transition metal on the lower electrode, and an upper electrode formed on the oxide layer. According to example embodiments, a reset current may be stabilized by unifying a current path on the oxide layer.

11 Claims, 7 Drawing Sheets

FIRST ANODE OXIDATION

NONVOLATILE MEMORY DEVICES AND METHODS OF MANUFACTURING THE SAME

PRIORITY STATEMENT

This application claims priority under 35 U.S.C. § 119 to Korean Patent Application No. 10-2005-0080617, filed on Aug. 31, 2005, in the Korean Intellectual Property Office (KIPO), the entire disclosure of which is incorporated herein by reference.

BACKGROUND

Example embodiments relate to nonvolatile memory devices and methods of manufacturing the same. For example, example embodiments may relate to nonvolatile memory devices having an oxide layer with resistance gradients, the nonvolatile memory devices having current paths that may be unified by regulating a width of the oxide layer using anodization, and methods of manufacturing the same.

DESCRIPTION OF THE RELATED ART

Characteristics of semiconductor memory devices may include integration density, operating speeds, and/or operating power. Research on semiconductor memory devices is ongoing to find ways of improving these characteristics.

Conventional semiconductor memory devices may include many memory cells connected in a circuit. In an example of a dynamic random access memory (DRAM), a unit memory cell may include a switch and/or a capacitor. A DRAM has advantages of good integration density and/or good operating speed. However, the DRAM is a volatile memory device having a disadvantage that stored data is lost after power is turned off.

An example of a memory device that may preserve stored data after loss of power (e.g., nonvolatile memory) is a flash memory. Compared to DRAM, flash memory may have disadvantages of low integration density and/or slow operating speeds.

Nonvolatile memory devices on which research is currently being performed may include magnetic random access memory (MRAM), ferroelectric random access memory (FRAM), phase-change random access memory (PRAM), and resistive random access memory (RRAM).

A MRAM may store data using changes in the magnetization direction within a tunnel junction. A FRAM may store data using polarization characteristics of a ferroelectric material. Each has its own advantages and disadvantages, but basically, research is performed to improve characteristics including integration density, operating speed, data retention, and/or operating power.

A PRAM may operate by storing data using a change of resistance according to a phase change. A typical resistance material used in the PRAM is a chalcogenide-type resistance material. The chalcogenide-type resistance material has a characteristic of higher resistance in an amorphous state than in a crystalline state. Using this characteristic, a memory device may be formed. When a conventional semiconductor manufacturing process is used to manufacture a PRAM, etching is difficult and/or takes a long time. Thus, competitiveness is decreased due to reduced productivity and/or increased manufacturing costs.

A RRAM has a data storage layer which may be formed of a transition metal oxide. The resistance of the data storage layer may change according to an applied voltage (e.g., resistance conversion property). FIGS. 1A and 1B show current paths formed on an oxide layer due to voltage applied in a general RRAM structure.

Referring to FIGS. 1A and 1B, the RRAM has a basic structure of an oxide layer 12, an upper electrode 13, and a lower electrode 11. The lower electrode 11 and the upper electrode 13 may be formed of a metal, for example, Ir, Ru, Au or Pt used for an electrode in a memory device, or its oxide. Also, the oxide layer 12 may be formed of a transition metal oxide having a resistance conversion characteristic (e.g., variable resistance). The oxide layer 12 may function as a data storage layer. For example, data may be recorded to or reproduced from the oxide layer 12 by applying voltage to the oxide layer 12 through the lower electrode 11 and/or the upper electrode 13.

When a voltage is applied to the lower electrode 11 and/or the upper electrode 13, a current may flow in the oxide layer 12. This current does not flow uniformly throughout the oxide layer 12, but flows forming an instantaneous current path 10 inside the oxide layer 12 due to a crystalline state of the oxide layer 12. The current path 10 formed inside the oxide layer 12 during this time is formed randomly. If the same voltage is applied to the lower electrode 11 and the upper electrode 13, a location and a number of the current path 10 formed may always be different.

FIG. 2 is a graph of current versus applied voltage of a conventional memory device having an oxide layer formed of a general resistance conversion material. For example, FIG. 2 may be a graph of the current flowing through the oxide layer 12 of the RRAM having the structure shown in FIG. 1A against the voltage applied to the lower electrode 11 and the upper electrode 13 of the same RRAM. For example, the oxide layer 12 may be formed of nickel oxide (NiO), the lower electrode 11 may be formed of Pt, and the upper electrode 13 may be formed of Pt.

Referring to FIG. 2, when measuring the current in the oxide layer 12 while increasing the voltage applied to the lower electrode 11 and the upper electrode 13 from 0 V, the current against the applied voltage differs at each measurement. In the example of a reset current (RC) measurement, there is a tenfold difference even when the same voltage is applied and a set voltage (SV) is also not uniform. When the RC has an unstable, high value, the reliability of a memory device decreases and power consumption increases.

SUMMARY

Example embodiments may provide reliable memory devices by decreasing and/or stabilizing a reset current and/or set current of the memory devices.

Example embodiments may also provide methods of manufacturing nonvolatile memory devices having a decreased and/or a stabilized reset current and/or a stabilized set current. Example embodiments may include memory devices having an oxide layer formed of a resistance conversion material.

According to an example embodiment, there may be provided a unit cell of a nonvolatile memory device including an oxide layer formed of a resistance conversion material. The unit cell may include a lower electrode, a nano-wire layer, an oxide layer formed on the nano-wire layer, and/or an upper electrode formed on the oxide layer.

In an example embodiment, the nano-wire layer may be formed of a transition metal.

In an example embodiment, the nano-wire layer may be formed of a transition metal including at least one material selected from the group consisting of Ni, Ti, Hf, Zr, Zn, W, Co, and Nb.

In an example embodiment, the width of the nano-wire layer may be 50 nm or less.

According to an example embodiment, the width of the oxide layer may be 50 nm or less.

In an example embodiment, the resistance conversion material may be a transition metal oxide.

In an example embodiment, the transition metal oxide includes at least one material selected from the group consisting of $NiO$, $TiO_2$, $HfO$, $ZrO$, $ZnO$, $WO_3$, $CoO$, and $Nb_2O_5$.

In an example embodiment, the thickness of the oxide layer may be in the range of 5 to 200 nm.

In an example embodiment, the lower electrode may be formed of a conductive material including at least one material selected from the group consisting of Al, Au, Pt, Ru, Ir, Ti, and a metal oxide.

According to another example embodiment, there may be provided a nonvolatile memory device including a unit cell and/or a switching device. The switching device may include a substrate, a first impurity region and/or a second impurity region on the substrate, a gate insulation layer contacting the first impurity region, the second impurity region, and/or the substrate, and/or a gate electrode layer on the gate insulation layer. The unit cell may further include the lower electrode of the unit cell electrically connected to the second impurity region.

According to another example embodiment, there may be provided a method of manufacturing a memory device including an oxide layer formed of a resistance conversion material. The method may include preparing and/or anodizing a substrate, forming a plurality of holes, forming a nano-wire layer by filling the plurality of holes with a metal, forming a lower electrode on the nano-wire layer, removing a portion of the substrate to expose a lower portion of the nano-wire layer, oxidizing the lower portion of the nano-wire layer to form the oxide layer, and/or forming an upper electrode on the oxide layer.

In an example embodiment, the substrate may be an Al substrate.

In an example embodiment, the metal may be a transition metal.

In an example embodiment, the transition metal may include at least one metal selected from the group consisting of Ni, Ti, Hf, Zr, Zn, W, Co, and Nb.

In an example embodiment, the width of each of the plurality of holes may be 50 nm or less.

In an example embodiment, the oxide layer may include at least one material selected from the group consisting of $NiO$, $TiO_2$, $HfO$, $ZrO$, $ZnO$, $WO_3$, $CoO$, and $Nb_2O_5$.

In an example embodiment, the oxide layer may be formed using an oxygen plasma process.

In an example embodiment, the oxide layer may be formed using a thermal oxidation process.

In an example embodiment, the thermal oxidation process may be performed at a temperature of 200° C. or more.

In an example embodiment, the anodizing may includes a first anodizing process in which a first porous oxide layer including a plurality of holes is formed on a surface of the substrate and/or a second anodizing process (and/or subsequent anodizing processes) in which the first porous oxide layer is removed to expose the substrate, and/or a second porous oxide layer comprising a plurality of holes is additionally formed.

In an example embodiment, there may be provided a method of manufacturing a memory device with the unit cell including forming first and/or second impurity regions on the substrate, forming a gate insulation layer on the substrate, contacting both impurity regions, forming a gate electrode layer on the gate insulation layer, and/or forming an insulation film layer on the exterior of the gate insulation layer, the substrate, and/or the gate electrode layer. The method may further include forming an electrical contact plug such that the lower electrode of the unit cell comes into electrical contact with the second impurity region.

BRIEF DESCRIPTION OF THE DRAWINGS

Example embodiments will become more apparent by describing the example embodiments in detail with reference to the attached drawings in which.

DETAILED DESCRIPTION OF EXAMPLE EMBODIMENTS

Figure 1A:
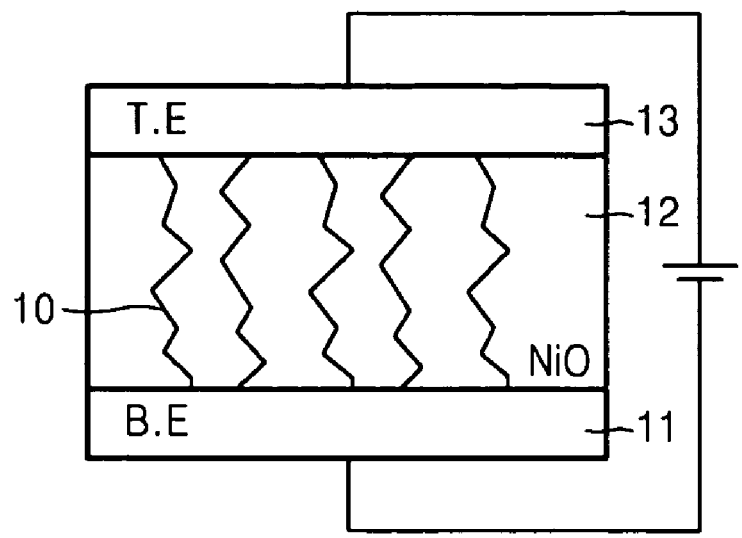
FIGS. 1A and 1B illustrate current paths on an oxide layer formed of a resistance conversion material when a voltage is applied.

Hereinafter, example embodiments will be described more fully with reference to the accompanying drawings. The accompanying drawings are intended to depict example embodiments and should not be interpreted to limit the scope thereof. The accompanying drawings are not to be considered as drawn to scale unless explicitly noted. In the drawings, the thicknesses and the widths of layers and regions are exaggerated for clarity.

It will be understood that if an element or layer is referred to as being "on," "against," "connected to," or "coupled to" another element or layer, then it can be directly on, against, connected, or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, , for example, "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term, for example, "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of all example embodiments. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 3A:
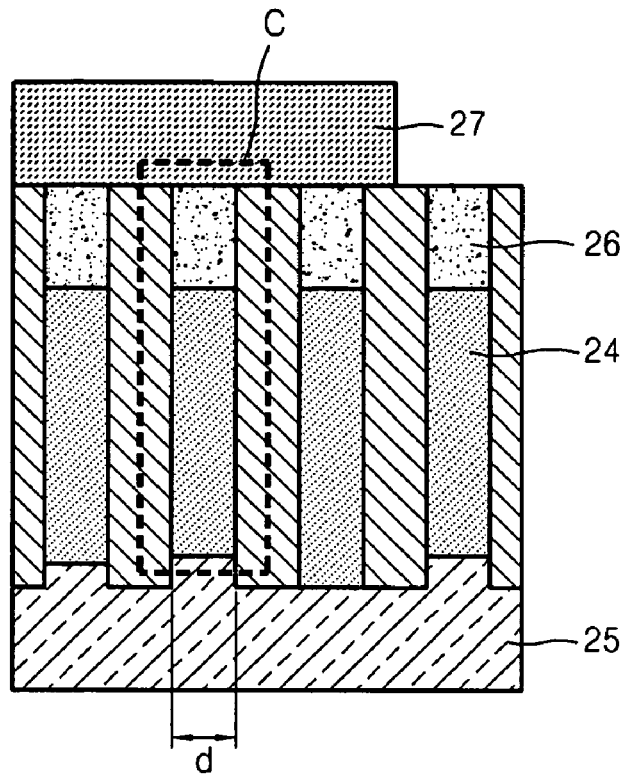
FIG. 3A may be a cross-sectional view illustrating a structure of a unit cell, according to an example embodiment.

FIG. 3A may be a cross-sectional view illustrating a structure of a nonvolatile memory device according to an example embodiment.

Referring to FIG. 3A, a unit cell C of a nonvolatile memory device may include a lower electrode 25, a nano-wire layer 24, an oxide layer 26, and/or an upper electrode 27. The lower electrode 25 may be a conductive material used for an electrode in a general semiconductor memory device. Metals, for example, Al, Au, Pt, Ru, Ir, Ti, or a conductive material including a metal oxide may be used to form the lower electrode 25. The nano-wire layer 24 may be formed of a material including at least one transition metal, for example, Ni, Ti, Hf, Zr, Zn, W, Co, and/or Nb. The oxide layer 26 may include a multi-layered resistance conversion material, which basically includes an oxide of a material forming the nano-wire layer 24. That is, the oxide layer 26 may be formed of a material including at least one of NiO, $TiO_2$, HfO, ZrO, ZnO, $WO_3$, CoO and $Nb_2O_5$. The upper electrode 27 may generally be a conductive material used for an electrode of a semiconductor memory device. Metals, for example, Al, Au, Pt, Ru, Ir, Ti or a conductive material including a metal oxide may be used to form the upper electrode 27. The width "d" of the oxide layer 26 of the nonvolatile memory device, according to an example embodiment, may be 50 nm or less. Through a C-AFM (Atomic Force Microscope) experiment, the width of the shortest current path on the oxide layer 26 of RRAM may be about 20 nm. Hence, in a nonvolatile memory device according to an example embodiment, the width of the oxide layer 26 may be 50 nm or less to unify the current path formed in the oxide layer 26. Thus, during operation of the nonvolatile memory device, according to an example embodiment, a reset current may decrease and/or stabilize, and/or a set current may stabilize.

In the non-volatile memory device illustrated in FIG. 3A, the lower electrode 25 and/or the upper electrode 27 may be formed on lower and/or upper parts of the oxide layer 26 respectively, and the oxide layer 26 may be formed of several multi-layered resistance conversion materials. A transistor or a diode may connect electrically to the lower electrode 25 or the upper electrode 27 of the unit cell "C". The transistor or diode and the unit cell may be used as the memory device. The non-volatile memory device according to an example embodiment may be formed of a 1S (switch)-1R (resistance) structure. For S, a transistor (e.g., 1T-1R) or a diode (e.g., 1D-1R) may be used.

Figure 3B:
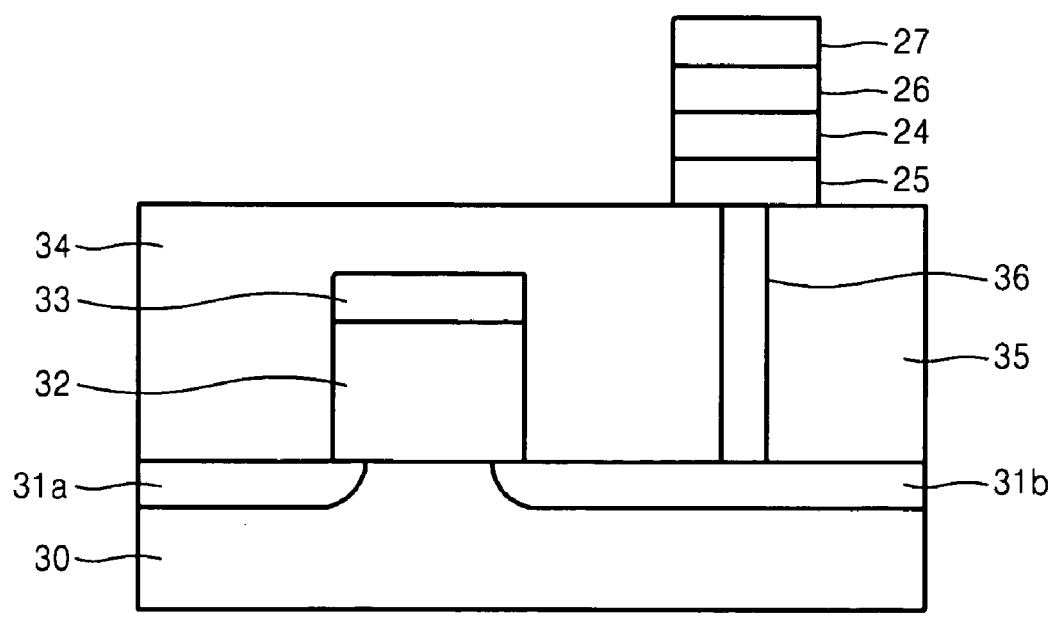
FIG. 3B may illustrate a non-volatile memory device having a unit cell connected to a transistor structure, according to another example embodiment.

FIG. 3B may illustrate a connection of a unit cell and a switching structure, according to an example embodiment. A memory device connected to one of the representative switching devices (e.g., a transistor structure) is shown, but example embodiments are not restricted thereto and a diode or other suitable device may also be used.

Referring to FIG. 3B, a first impurity region 31a and a second impurity region 31b may be formed on a substrate 30. A gate insulation layer 32 may also be formed on the substrate 30, contacting the first impurity region 31a and the second impurity region 31b. A gate electrode layer 33 may be formed on the gate insulation layer 32, and interlayer insulation films 34 and 35 may be formed exterior to the substrate 30, the gate insulation layer 32, and the gate electrode layer 33. The lower electrode 25 of the unit cell "C" of FIG. 3A may be electrically connected to the second impurity region 31b by a contact plug 36. The contact plug 36 may pass through the interlayer insulation films 34 and 35. The transistor structure may be formed using a general semiconductor device manufacturing process, for example, physical vapor deposition (PVD), atomic layer deposition (ALD), or chemical vapor deposition (CVD).

Figure 5:
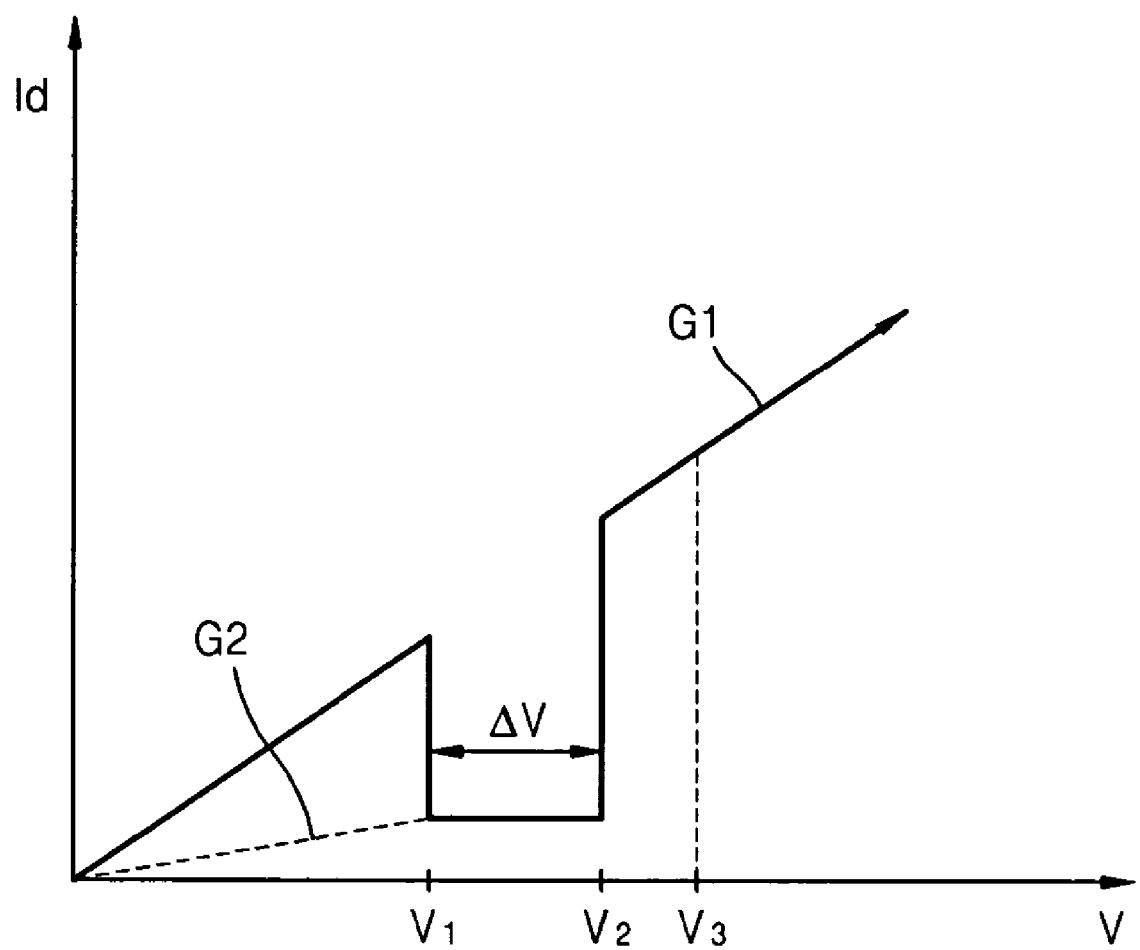
FIG. 5 may be a graph of an operating characteristic of a memory device having a resistance conversion material, according to an example embodiment.

An operating characteristic of the nonvolatile memory device according to an example embodiment may be explained by referring to FIG. 5. FIG. 5 may be a graph showing an electrical characteristic of a memory device having a resistance conversion material. In FIG. 5, the horizontal axis is the applied voltage and the vertical axis is the current according to the applied voltage.

Referring to FIG. 5, when the voltage increases from 0 V passing through the lower electrode 25 and the upper electrode 27 shown in FIG. 3A, the current may increase following a G1 line in proportion with the voltage. However, when a voltage of at least $V_1$ is applied, the resistance may suddenly rise and the current may decrease. When a voltage in the range of $V_1$ to $V_2$ is applied, the current may increase following a G2 line. When a voltage of at least $V_2$ ($V_2 > V_1$) is applied, the resistance may suddenly decrease, and the current may increase and follow the G1 line again.

If the voltage is greater than $V_1$, an electrical characteristic of the memory device may be determined by the size of the applied voltage. The electrical characteristic may be confirmed by applying a voltage less than $V_1$. For example, it may be explained as follows.

When a voltage in the range of $V_1$ to $V_2$ is applied to the memory device and a voltage less than $V_1$ is subsequently applied, the measured current follows the G2 line. However, when a voltage greater than $V_2$ is applied (e.g., $V_3$) to the memory device and a voltage less than $V_1$ is subsequently applied, the measured current follows the G1 line. Thus, the electrical characteristic of the memory device determined by the applied voltage in the range of $V_1$ and $V_2$ may be assigned to logic "0" and the electrical characteristic of the memory device determined by the applied voltage over $V_2$ may be assigned to logic "1".

Figure 1B:
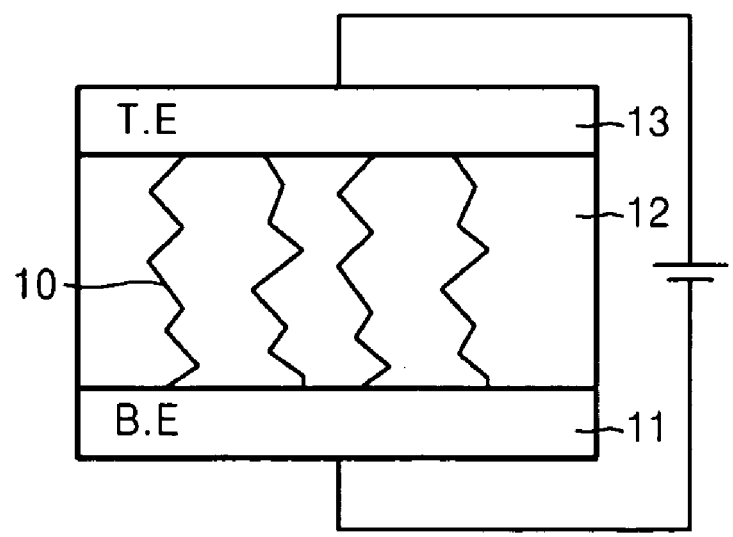
Figure 2:
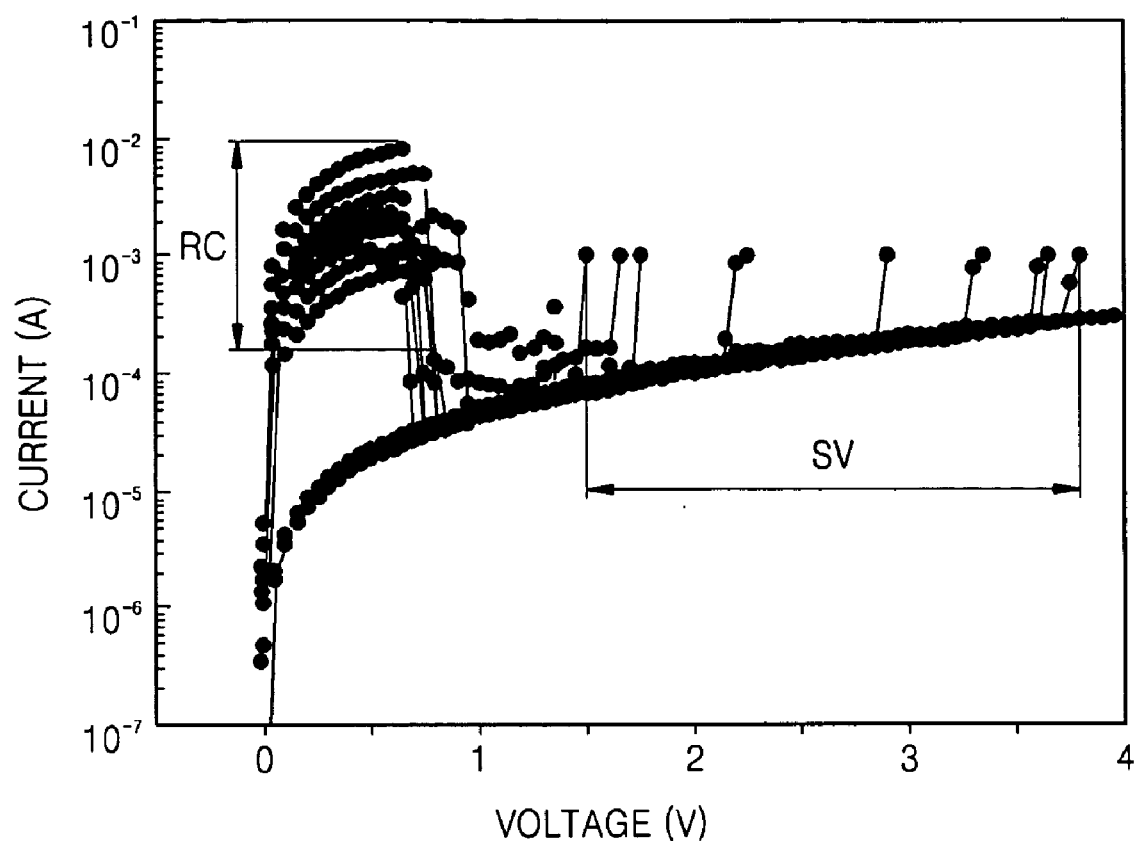
FIG. 2 is a graph of current versus applied voltage of a conventional memory device having an oxide layer formed of a resistance conversion material.

In the conventional memory device shown in FIGS. 1A and 1B, the current in the reset state is not stable, as current paths differ when voltage is applied. However, in the non-volatile memory devices according to example embodiments, the current paths may be unified to stabilize the current in the reset state, and hence a more reliable memory device may be provided.

Hereinafter, methods of manufacturing nonvolatile memory devices according to example embodiments may be provided. FIGS. 4A through 4G may illustrate a method of manufacturing the structure shown in FIG. 3A.

Basically, the nonvolatile memory device illustrated in FIG. 3A is manufactured by forming the width of the oxide layer 26 shown in FIG. 3A to be 50 nm or less. This may be achieved using an anodizing process.

Figure 4A:
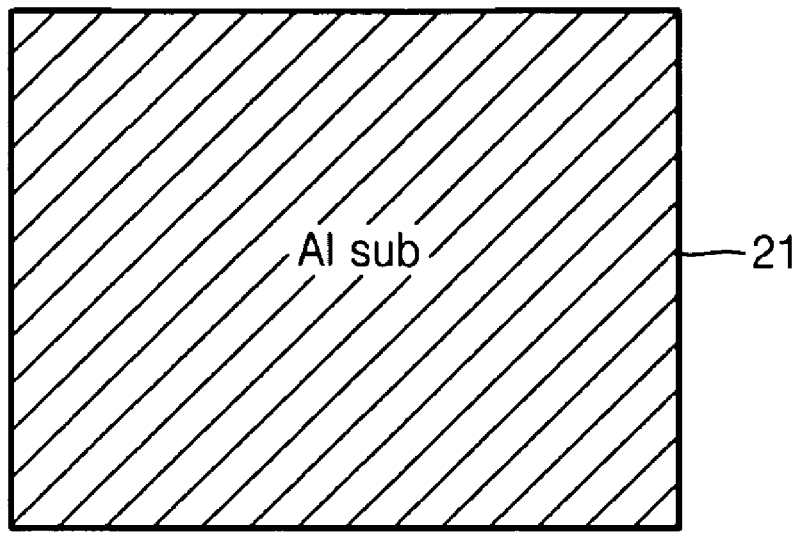
FIGS. 4A through 4G may illustrate a method of manufacturing a nonvolatile memory device according to another example embodiment.

Referring to FIG. 4A, an Al (aluminium) substrate 21 is prepared. The Al substrate 21 may be formed of a pure Al plate, but it may also have a structure of an Al film formed on a separate supporting plate or any other suitable arrangement. The substrate 21 may also be formed of another material.

Figure 4B:
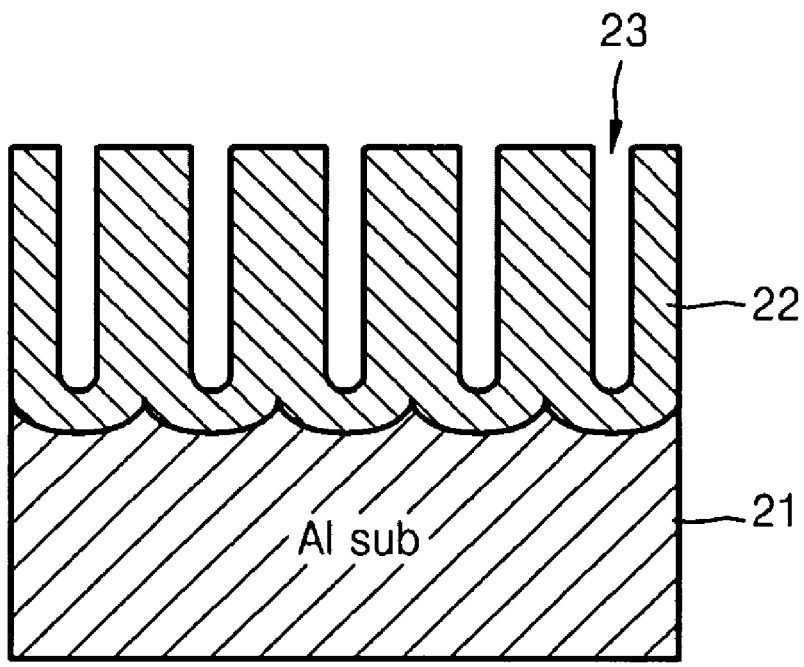

Referring to FIG. 4B, a porous Al oxide layer 22 (formed of $Al_2O_3$) may be formed by oxidizing the Al substrate 21 to a predetermined or desired depth using anodization whereby a plurality of holes 23 are formed in the porous Al oxide layer 22.

When the anodizing process is performed for the first time, inner walls of the plurality of holes 23 may be irregular due to surface morphology on the Al substrate 21. Hence, the anodizing process may be performed twice (or more). A first porous Al oxide layer may be removed using an etchant, and a second anodizing process may be performed on the surface of the exposed Al substrate 21 under the same conditions. As a result, a second porous Al oxide layer 22 having uniform size holes 23 may be obtained.

The diameter and/or the depth of the holes 23 may be regulated by controlling the temperature, the density, or the applied voltage of a solution used in the anodizing process. The solution used in the anodizing process may include sulphuric acid, oxalic acid, and/or chromic acid. In the nonvolatile memory device illustrated in FIG. 3A, the width of the oxide layer 26 may be 50 nm or less, and thus the diameter of the holes 23 may be 50 nm or less, and the depth of the holes 23 may be in the range of hundreds of nm to 10 um.

Figure 4C:
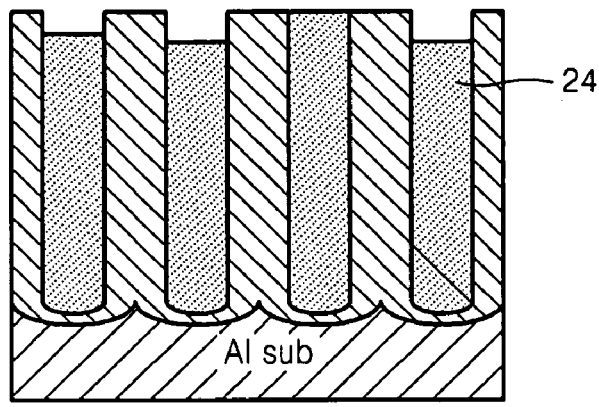

Referring to FIG. 4C, a nano-wire layer 24 may be formed by filling the plurality of holes 23 illustrated in FIG. 4B with at least one transition metal material, for example, Ni, Ti, Hf, Zr, Zn, W, Co and Nb using an electro-deposition method, for example, electroplating. When the transition metal material is applied inside the holes 23, the nano-wire layer 24 may have a porous structure. Hence, the holes 23 may be filled intermittently. The transition metal material, for example, Ni, Ti, Hf, Zr, Zn, W, Co or Nb is conductive by itself, and it should be noted that when it forms an oxide, it may be used as a resistance conversion material.

Figure 4D:
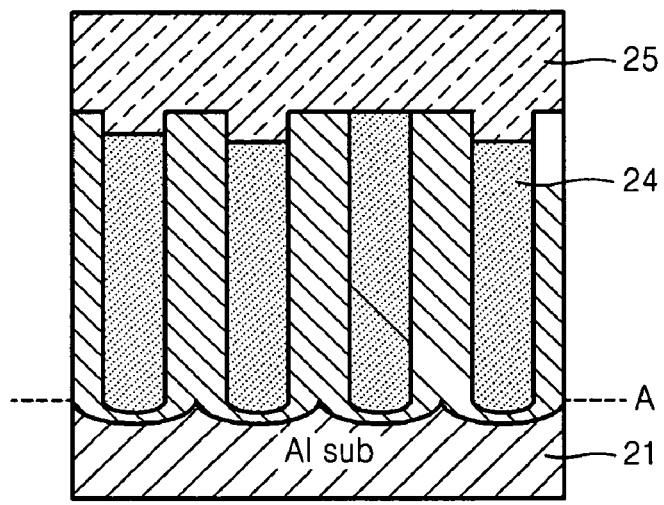

Referring to FIG. 4D, a lower electrode 25 may be formed by applying a material, for example, Al, Au, Pt, Ru, Ir and Ti, or a conductive material having a metal oxide to the nano-wire layer 24 using a general semiconductor device manufacturing process, for example, CVD, PVD or ALD. In FIG. 4D, the lower electrode 25 may be formed as a whole, but if required, the lower electrode 25 of each nano-wire of the nano-layer 24 may be separated by removing the material between the nano-wires.

Figure 4E:
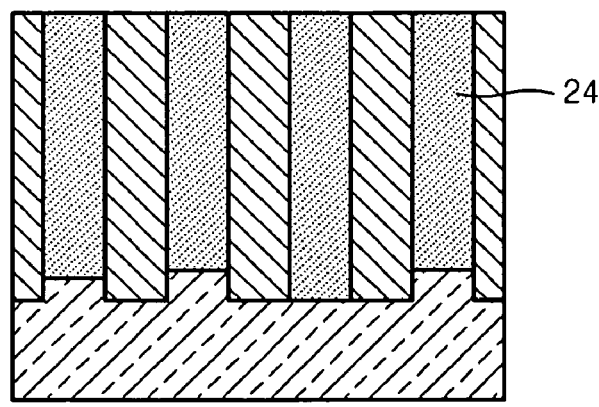

Referring to FIG. 4E, the Al substrate 21 illustrated in FIG. 4D is removed beneath a line "A" also shown in FIG. 4D. For the removal, an Ar etching process or a chemical mechanical polishing (CMP) process may be used. When the Al substrate 21 is removed, the telocentric of the nano-wire layer 24 may be exposed. Here, FIG. 4E is FIG. 4D turned upside down.

Figure 4F:
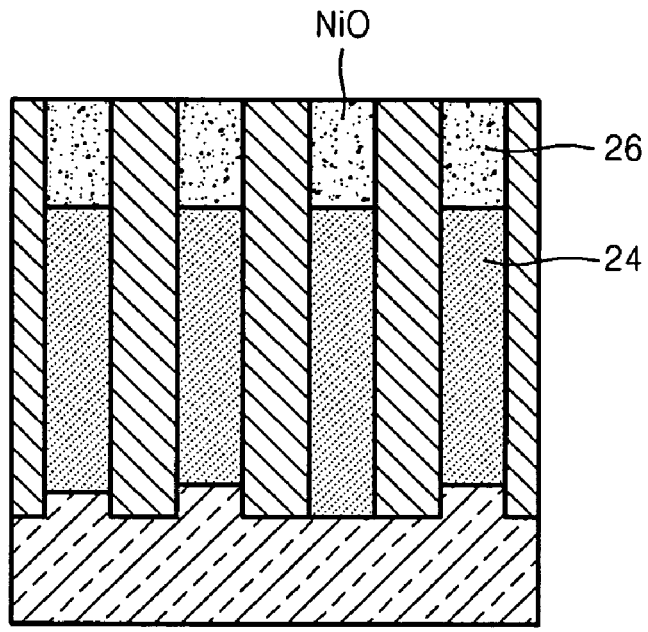

Referring to FIG. 4F, an oxide layer 26 is formed on the nano-wire layer 24 by performing an oxygen plasma process or a thermal oxidation process on the exposed nano-wire layer 24. The nano-wire layer 24 is formed of a transition metal and consequentially, the oxide layer 26 is formed of a transition metal oxide. In detail, when the nano-wire layer 24 is formed of Ni, Ti, Hf, Zr, Zn, W, Co or Nb, the oxide layer 26 is formed of NiO, $TiO_2$, HfO, ZrO, ZnO, $WO_3$, CoO or $Nb_2O_5$ respectively. Of course, the oxidation conditions may differ. The oxygen plasma process may be performed independent of temperature. The thermal oxidation process may be performed at a temperature of about 200° C. or more. During the thermal oxidation process, the width of the oxide layer 26 may be formed to be in the range of 5 to 200 nm considering the formation of a current path.

Figure 4G:
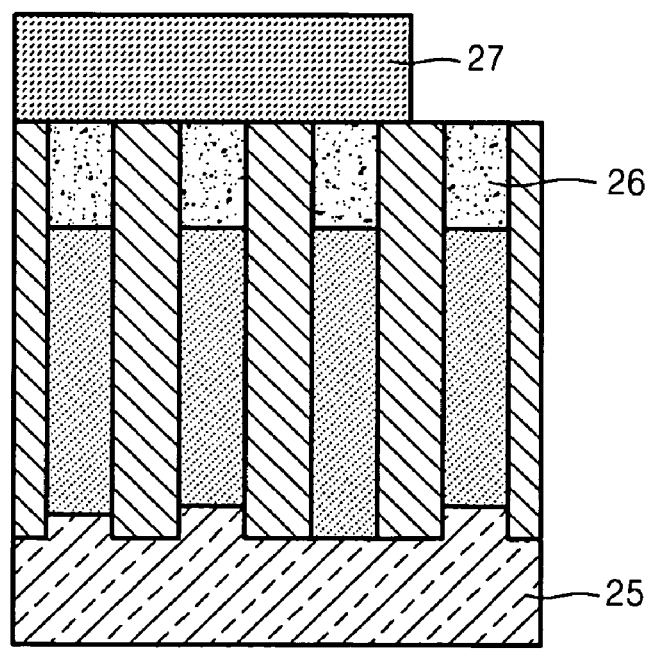

Referring to FIG. 4G, an upper electrode 27 may be formed on the oxide layer 26 illustrated in FIG. 4F to complete the nonvolatile memory device according to an example embodiment. Like the lower electrode 25, the upper electrode 27 may be formed of a material, for example, Al, Au, Pt, Ru, Ir and Ti, or a conductive material having a metal oxide. Of course, the upper electrode 27 of each oxide layer 26 may be separated by removing the electrode material on the Al oxide layer 22 between the oxide layer 26.

Example embodiments may provide one or more of the following effects.

By limiting the width of an oxide layer, current paths may be unified, which may reduce and/or stabilize a reset current of a memory device having resistance conversion material. Thus, power consumption may be decreased and/or a reliable memory device may be secured.

By improving and/or stabilizing the scattering of a set current, a reliable memory device may be obtained.

The width of an oxide layer may be regulated by controlling properties of the solution used during an anodizing process, for example, density and/or temperature.

While example embodiments have been shown and described with reference to particular example embodiments, the example embodiments discussed should be considered in descriptive senses only and not for purposes of limitation. The structure of the memory device of FIG. 3B is connected to a transistor, but the memory device may also be connected to a diode or other device for use as a nonvolatile memory device. Also, an oxide layer may be formed of any resistance conversion material without limits, besides the disclosed materials. Therefore, it will be understood by those of ordinary skill in the art that various changes in form and details may be made therein without departing from the spirit and scope of example embodiments as defined by the following claims.

What is claimed is:

1. A method of manufacturing a unit cell comprising:
   anodizing a substrate to form a plurality of holes;
   forming a nano-wire layer by filling the plurality of holes with a metal;
   forming a lower electrode on an upper portion of the nano-wire layer;
   removing a portion of the substrate to expose a lower portion of the nano-wire layer;
   oxidizing the lower portion of the nano-wire layer to form an oxide layer; and
   forming an upper electrode on the oxide layer.

2. The method of claim 1, wherein the substrate is an Al substrate.

3. The method of claim 1, wherein the metal is a transition metal.

4. The method of claim 3, wherein the transition metal includes at least one metal selected from the group consisting of Ni, Ti, Hf, Zr, Zn, W, Co, and Nb.

5. The method claim 1, wherein a width of each of the plurality of holes is 50 nm or less.

6. The method of claim 1, wherein the oxide layer includes at least one material selected from the group consisting of $NiO$, $TiO_2$, $HfO$, $ZrO$, $ZnO$, $WO_3$, $CoO$, and $Nb_2O_5$.

7. The method of claim 1, wherein the oxide layer is formed using an oxygen plasma process.

8. The method of claim 1, wherein the oxide layer is formed using a thermal oxidation process.

9. The method of claim 8, wherein the thermal oxidation process is performed at a temperature of 200° C. or more.

10. The method of claim 1, wherein the anodizing includes:
    forming first porous oxide layer with a first anodizing process;
    removing the first porous oxide layer to expose the substrate; and
    forming a second porous oxide layer with a second anodizing process.

11. A method of manufacturing a memory device comprising:
    forming a first and a second impurity region on a substrate with a space there-between;
    forming a gate insulation layer contacting the first and the second impurity regions and the substrate;
    forming a gate electrode layer on the gate insulation layer;
    forming an insulation film layer on the exterior of the substrate, the gate insulation layer, and the gate electrode layer;
    forming an electrical contact plug through the insulation film layer such that an electrical connection is made between the electrical contact plug and the second impurity region;
    performing the method of claim 1 such that an electrical connection is made between the lower electrode and the electrical contact plug.

* * * * *